United States Patent [19]

Kobayashi et al.

[11] Patent Number: 4,608,494

[45] Date of Patent: Aug. 26, 1986

[54] COMPONENT ALIGNMENT APPARATUS

[75] Inventors: Mamoru Kobayashi; Hideaki Sasaki, both of Hadano; Yasuhiko Hara, Machida, all of Japan

[73] Assignee: Hitachi, Ltd., Tokyo, Japan

[21] Appl. No.: 669,437

[22] Filed: Nov. 8, 1984

[30] Foreign Application Priority Data

Nov. 11, 1983 [JP] Japan ................... 58-210870

[51] Int. Cl.$^4$ ............... G01M 11/00; G01N 21/64
[52] U.S. Cl. ................... 250/461.1; 250/458.1; 356/400
[58] Field of Search ............ 250/491.1, 461.1, 458.1; 378/206, 68, 35, 20; 356/399, 400

[56] References Cited

U.S. PATENT DOCUMENTS 3,617,744  11/1971  Irish ................... 250/461.1

OTHER PUBLICATIONS

C. A. Gaston, "Alignment Beamsplitter Cube" IBM® Technical Disclosure Bulletin, vol. 25, No. 5, (Oct. 1982), pp. 2301-2303.

Primary Examiner—Bruce C. Anderson
Assistant Examiner—Constantine Hannaher
Attorney, Agent, or Firm—Antonelli, Terry & Wands

[57] ABSTRACT

An apparatus for the alignment of electronic components to be mounted on a printed board. The alignment is accomplished by illuminating the surface of the printed board to cause emission of a fluorescent light from the substrate of the printed board, detecting the fluorescent light by optical means to detect an image of the conductor pattern of the printed board as a negative picture, taking an image of the electronic component leads through a different optical route and calculating the amount of deviation in position of the leads of an electronic component in accordance with the picture data obtained by both images, in order to correct the deviation.

5 Claims, 8 Drawing Figures

COMPONENT ALIGNMENT APPARATUS

BACKGROUND OF THE INVENTION

The present invention relates to an apparatus for aligning electronic components and more particularly to an apparatus in which the position of a pattern on a printed board and the position of each lead of an electronic component are detected by optical means and the amount of deviation in position between the two is calculated from their picture data thereby correcting the deviation.

Some of apparatus heretofore known for performing the alignment operation required for mounting electronic components on a printed board (printed-circuit board) will now be described by way of example.

One of the known methods is designed so that after the leads of an electronic component have been preliminarily aligned with a gap over the conductor pattern of a horizontally arranged printed board, the operator corrects any positional deviation by moving the electronic component or the printed board while simultaneously observing visually the images of the pattern and the leads from just above through a magnifying glass or the like.

Another method is to preliminarily align the leads of an electronic component over the conductor pattern of a printed board in the same manner as mentioned above. Then, a picture is taken by a camera from just above the leads of the electronic component and the picture is reproduced on a television reciever. The operator corrects any positional deviations by moving the electronic component or the printed board while observing the picture of the leads against the pattern reproduced in enlarged form on the television screen instead of directly observing the images visually.

With the recent increase in electronic component lead density, however, there has been a need for a method capable of aligning an electronic component on a conductor pattern with greater accuracy and the above-mentioned methods of effecting the desired alignment by detecting the relative positional relation between a lead image and a pattern image through visual observation are disadvantageous from the standpoints of production efficiency and accuracy. Thus, there has existed a need for an automatic alignment apparatus.

Various types of automatic alignment apparatus using pattern recognition techniques have been developed. The following is an example of this type of apparatus. This apparatus first takes a picture of a pattern illuminated by a lamp by a first camera; then it preliminary aligns an electronic component held by a chuck over the pattern; then it takes a picture of the leads of the electronic component illuminated by a lamp by a second camera; and then it supplies the pictures taken by the cameras to a recognition device. In the recognition device, after the pictures of the pattern and the leads have each been converted to digital form and stored in a picture memory, the pictures in the memory are compared and positional deviation values are calculated. In this case, the reason for using the two cameras for photographing twice is that the simultaneous photographing of the pattern and the leads by one camera cannot ensure a satisfactory resolution for the pictures due to the gap between the pattern and the leads. It is to be noted that in this apparatus the reflected light from the pattern or the leads is detected from a direction perpendicular to the printed board and a half mirror or the like is used to branch and direct the vertical component of the reflected light to the two cameras.

However, a method of the kind which utilizes the reflected light from a pattern as in the case of the above-mentioned automatic alignment apparatus involves a substantial disadvantage. Namely, where the pattern is a solder pattern, the surface condition is not uniform and there are the variations in surface condition among individual sample of pattern. In other words, there is a disadvantage that since there are the variations in shape, surface luster, etc., among the different samples, the reflected light from the pattern is not stable and the binarization of picture information is not an easy matter. There is another problem that depending on the manner of illumination the surface of the printed board gleams thus making it difficult to distinguish the pattern from the printed board substrate.

The present invention has been made on the basis of an idea of utilizing the fluorescent light emitted from the substrate of a printed board, which occurred in the course of an investigation into any other method than the method of utilizing the reflected light from a pattern.

SUMMARY OF THE INVENTION

With a view to overcoming the foregoing deficiencies in the prior art, it is an object of the present invention to provide an improved component alignment apparatus employing a fluorescence detecting method for the detection of a pattern on a printed board thereby detecting and correcting any positional deviation of an electronic component from a high-density pattern with greater accuracy.

Thus, the present invention features a component alignment apparatus for aligning an electronic component with the conductor pattern of a printed board for mounting the component, the apparatus including first illuminating means for illuminating the printed board in a manner that a fluorescent light is emitted from the substrate of the printed board, second illuminating means for illuminating the leads of an electronic component positioned over the conductor pattern of the printed board, a detection head for detecting a printed board pattern image produced by the emitted fluorescent light and a lead image produced by the lead illuminating light, means for photographing the printed board pattern image and the lead image, means for recognizing the photographed printed board pattern picture and lead picture so as to compute the amounts of deviation in position therebetween, and means for correcting the position of the leads with respect to the printed board pattern in accordance with the amounts of deviation.

It is another object of the invention to provide such component alignment apparatus so designed that the central axes of printed board pattern image and lead image are aligned with the same axis and the two images are directed to a single optical system thereby ensuring improved detection accuracy.

Thus, the present invention features that the detection head includes openings for separately passing the printed board pattern image and the lead image, a mirror arranged to transmit the emitted fluorescent light and reflect the lead illuminating light and thereby align the optical axes of the printed board pattern image and the lead image with the same axis, and a filter inserted in the optical path of the fluorescent light to mainly transmit the wavelengths in the fluorescent light region.

DESCRIPTION OF THE PREFERRED EMBODIMENTS

An embodiment of the present invention will now be described with reference to the drawings.

Figure 1:
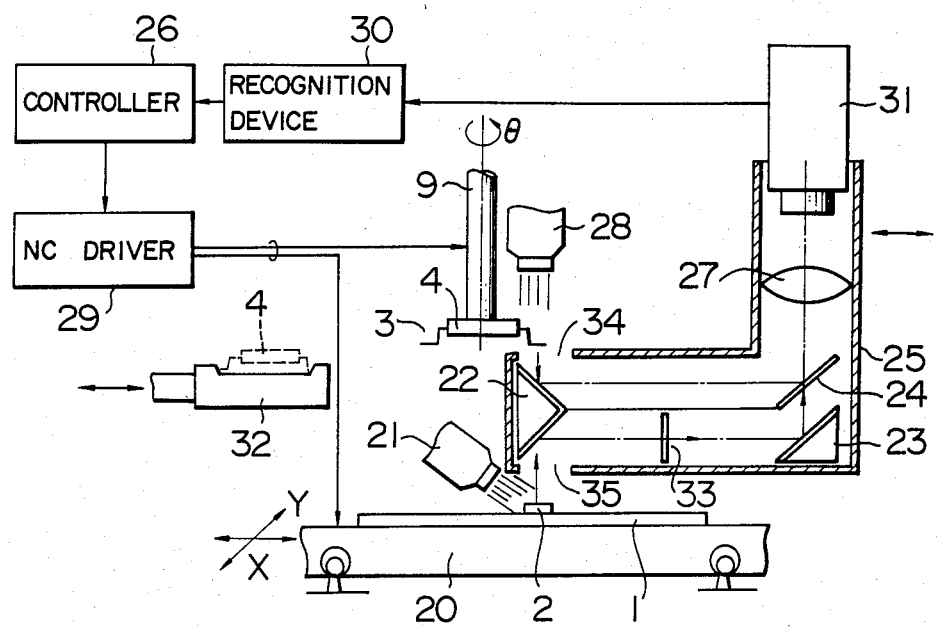
FIG. 1 is a schematic diagram showing the construction of an embodiment of the invention.
Figure 2:
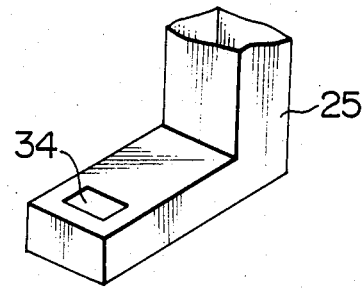
FIG. 2 is a perspective view showing the detection head section of the embodiment of FIG. 1.

FIG. 1 is a schematic side view of an automatic alignment apparatus according to the embodiment and the Figure particularly shows in section the housing portion of a detection head 25 forming a principal part of the invention thus showing in detail the internal construction of the head 25. An XY-table 20 is a table on which a printed board 1 is mounted and moved in X and Y directions on a horizontal plane. A pallet 32 holds a component 4 on it for transportation. A chuck 9 is provided to chuck the component 4 and it has a mechanism such that the component 4 is rotated through an angle $\theta$ within the horizontal plane or the component 4 is mounted on pattern 2. A lamp 21 forming a light source includes an extra-high pressure mercury-vapor lamp or the like for projecting light to the printed board 1 and exciting its substrate to emit a fluorescent light. The lamp 21 incorporates therein a filter so that light of wavelengths near 370 nm (the ultraviolet region) is generated and light of the other wavelengths is cut off. In this case, the light of wavelengths near 370 nm can cause the substrate to emit the maximum amount of fluorescent light and these wavelengths differ with different materials for the substrate. In the present embodiment, the substrate material is either glass epoxy or polyimide. It is known that the illumination of such substrate with light of wavelengths in the above-mentioned range results in the emission of a fluorescent light whose peak light intensity is at around a wavelength of 440 nm. It is to be noted that instead of employing the lamp 21, the illuminating light from the light source may be directed to the printed board through an optical fiber. In this case, the optical fiber should preferably be made of a material having a minimum attenuation factor to the light beams of the ultraviolet region. Note that the pattern 2 is metal thus emitting no fluorescent light. A lamp 28 generates an ordinary visible light. Since the generated light is the ordinary visible light, the peak of its light intensity is at a wavelength higher than 600 nm. The external shape of the detection head 25 is formed as shown by the perspective view of FIG. 2 and it includes an opening 34 formed in the upper part of its horizontal arm at near the forward end thereof and an opening 35 arranged just below the opening 34. Although not shown, each of the openings 34 and 35 is provided with an externally controllable shutter so as to open and close the opening. The internal construction of the detection head 25 is shown in FIG. 1. A mirror 22 is composed of two reflecting mirrors arranged to form an angle of 90°. The upper reflecting mirror has its reflecting surface turned up and it forms an angle of 45° with the horizontal plane. This reflecting mirror has a high reflectance to the visible light so that the visible light projected from above through the opening 34 (i.e., a lead image formed by a lead illuminating light) is reflected horizontally and directed to the inner part of the detection head 25. The lower mirror has its reflecting surface turned down, forms an angle of 45° with the horizontal plane and has a good reflectance to the fluorescent light emitted from the substrate thereby horizontally reflecting the light incident from below through the opening 35 (i.e., a pattern image) and directing the light to the inner part of the detection head 25. The incident light through the opening 35 includes the light beam emitted from the lamp 21 and reflected by the surface of the printed board 1 and the fluorescent light emitted from the substrate of the printed board 1. A filter 33 cuts off the reflected light from the surface of the printed board 1 and transmits the fluorescent light emitted from the substrate. A mirror 23 is arranged at the lower corner of the detection head 25, has its reflecting surface turned up and forms an angle of 45° with the horizontal plane. Thus, the light falling horizontally on the mirror 23 through the filter 33 is reflected upward directly. A mirror 24 is a special mirror which passes the fluorescent light incident from below and reflects the visible light incident horizontally. This type of mirror has already been available commercially. While the light beams passed through the mirror 24 are directed upward, the central axes of the fluorescent light and the visible light are each aligned with the same axis. A lens 27 is provided to converge these light beams. Note that instead of arranging at the position shown in FIG. 1, the filter 33 may be positioned between the lens 27 and a camera 31. In this case, as will be described later, the visible light incident through the opening 34 is greater in quantity than the fluorescent light incident through the opening 35 and thus a part of the visible light enters the camera 31 through the filter 33. It is to be noted that the detection head 25 must be arranged so that the length of an optical path including leads 3, the mirrors 22 and 24 and the lens 27 is equal to the length of an optical path including the pattern 2, the mirrors 22, 23 and 24 and the lens 27. The camera 31 photographs as a picture the light emerging from lens 27 and sends the picture to a recognition device 30.

Figure 4:
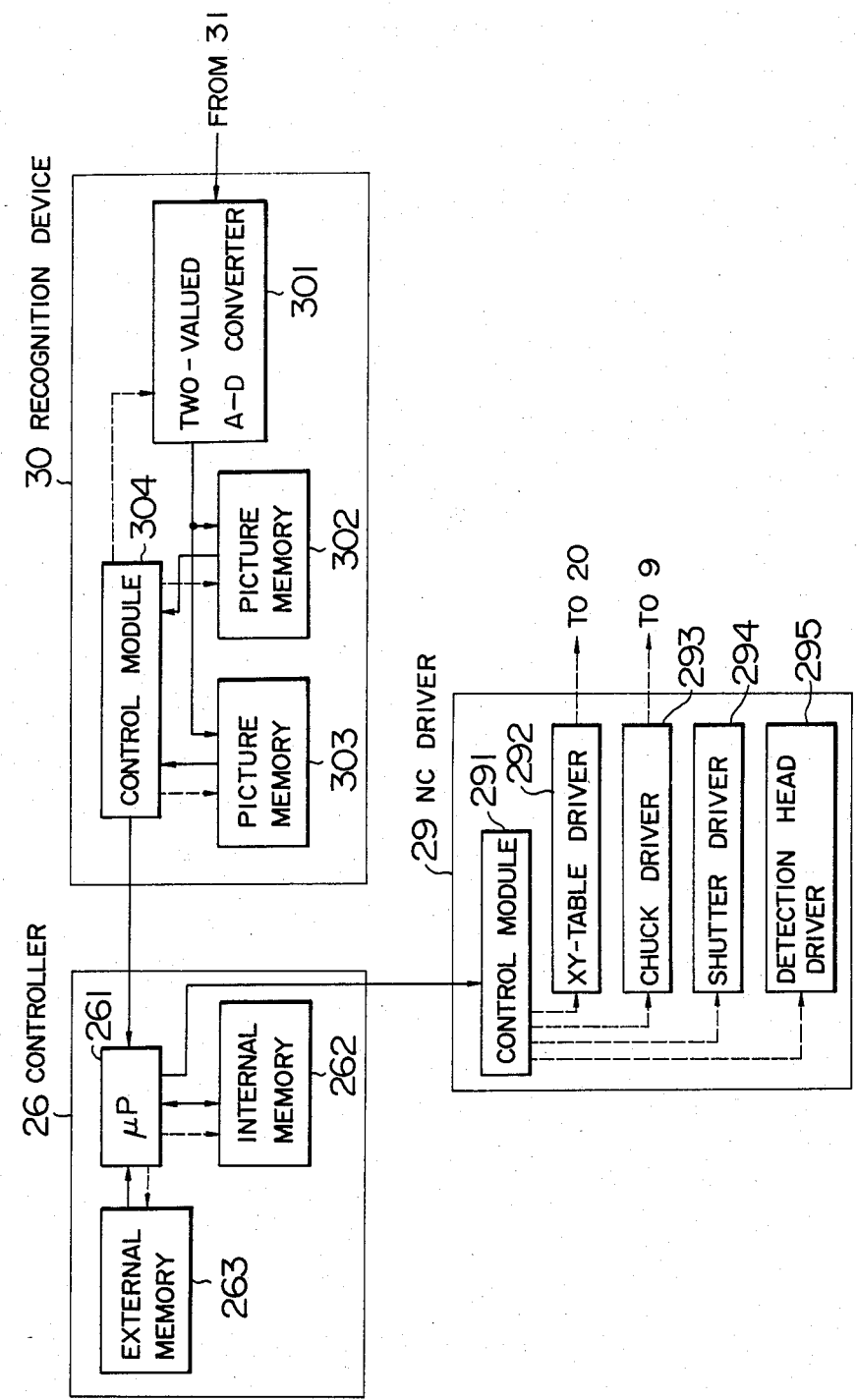
FIG. 4 is a block diagram showing the internal construction of the electronic device section of the embodiment.

FIG. 4 is a block diagram showing an example of the internal construction of the recognition device 30, a controller 26 and an NC driver 29. In the Figure, the solid lines show the data flow and the broken lines show the control flow. The recognition device 30 binarizes or digitizes the pictures of the pattern 2 and the leads 3, stores them in its internal picture memories and subjects them to pattern recognition. A digitizer or two-valued A-D converter 301 is a circuit whereby the video signal applied from the camera 31 is binarized or digitized by thresholding in accordance with a predetermined threshold value, picture memories 302 and 303 respectively store the picture of the pattern 2 and the picture of the leads 3, and a control module 304 governs the overall control of the recognition device 30. The control module 304 scans the picture of the pattern 2 stored in the picture memory 302 to detect the X and Y coordinates of the center point of each of the pads (the connection portions) of the pattern 2 and the control module 304 also scans the picture of the leads 3 stored in the picture memory 303 to detect the X and Y coordinates of the center point of each leads. These X and Y coordinates are sent to the controller 26. The controller 26 includes a microprocessor 261, an internal memory 262 and an external memory 263. The internal memory 262 supplies program and data to the microprocessor 261 and the external memory 262 stores preliminarily the reference X and Y coordinates of the pads of the pattern 2 as a dictionary. The microprocessor 261 includes a computer for controlling the controller 26 on the whole. The microprocessor 261 receives the X and Y coordinates of the individual pad and lead from the recognition device 30, computes positional deviation values $\Delta X$, $\Delta Y$ and $\Delta \theta$ of the component 4 from the pattern 2 and sends the deviation values to the NC driver 29. Also, when the next component is to be mounted, the microprocessor 261 sends the differences between the current X and Y coordinates and the X and Y coordinates of the next component obtained from the dictionary to the NC driver 29. The NC driver 29 includes an XY-table driver 292, a chuck driver 293, a shutter driver 294, a detection head driver 295 and a control module 291. The control module 291 controls the NC driver 29 on the whole so that when the X and Y coordinate differences or $\Delta X$, $\Delta Y$ and $\Delta \theta$ deviations are received from the controller 26, the XY differences or deviations are sent to the XY-table driver 292 to move the XY-table 20 and the deviation $\Delta \theta$ is sent to the chuck driver 293 to rotate the chuck 9 around its axis, thereby aligning the component 4. When a command is received from the controller 26 to move the chuck 9 vertically, the control module 291 moves the chuck 9 vertically through the chuck driver 293. Also, the control module 291 is responsive to a command from the controller 26 to open or close the shutter associated with the opening 34 or 35 through the shutter driver 294. Further, the control module 291 is responsive to a command from the controller 26 to move the detection head 25 horizontally through the detection head driver 295. While the construction and operation of the recognition device 30, the controller 26 and the NC driver 29 have been described by way of example, the techniques in this field are well known and therefore various other embodiments may be made without departing from the spirit and scope of the invention.

Figure 3A:
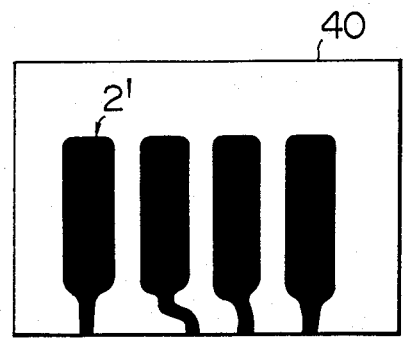
FIGS. 3a and 3b illustrate pictures showing pattern image and lead image, respectively.
Figure 3B:
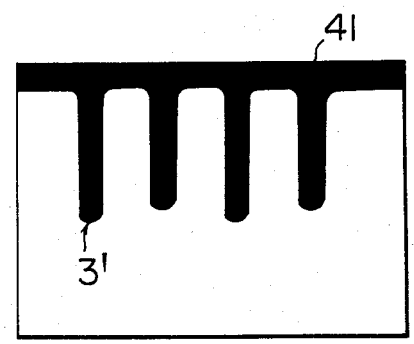

The operation of this embodiment will now be described. Let it be assumed that the component 4 has been placed on the pallet 32. Firstly, the controller 26 sends the required amounts of X and Y movements to the NC driver 29 and then the XY-table 20 is moved thereby moving the printed board 1 into the desired position. Then, the pallet 32 is moved to a position just below the chuck 9 so that the chuck 9 comes into operation and the component 4 is held by vacuum chucking thereby completing a preliminary alignment of the component 4. Thus, the pallet 32 is moved back to the initial position. Then, the detection head 25 is moved horizontally in such a manner that the straight line connecting the lead 3 and the corresponding pattern 2 is placed in a position where it extends through the openings 34 and 35. Assume now that the lamps 21 and 28 are both giving light. The light beam projected from the lamp 21 is reflected by the printed board 1 and the pattern 2 and also a fluorescent light is emitted by the substrate of the printed board 1. Assuming that the shutter of the opening 35 is open, the reflected beams and the fluorescent light are passed through the opening 35, reflected by the lower reflecting mirror of the mirror 22, passed straight horizontally through inside the detection head 25 and passed through the filter 33 which cuts off the reflected beams and allows only the fluorescent light to pass straight forward. thus, the fluorescent light is reflected by the mirror 23 so that its direction of travel is changed to an upward direction, passed through the mirror 24, converged by the lens 27 and then projected to the camera 31. On the other hand, only a part of the visible light emitted from the lamp 28 is cut off by the leads 3 and the remainder is passed freely. Assuming now that the shutter of the opening 34 is open, this visible light is passed through the opening 34, reflected by the upper reflecting mirror of the mirror 22, passed straight horizontally inside the detection head 25, reflected by the mirror 24 to change its direction of travel to an upward direction, aligned with the same axis as the fluorescent light coming from below, passed straight forward, converged by the lens 27 and then projected to the camera 31. Assuming that initially the operation is started in a condition where the shutter of the opening 34 is closed and the shutter of the opening 35 is open, then only the light beams incident from below through the opening 35 are introduced into the detection head 25 and image of the pattern 2 is photographed by the camera 31. The recognition device 30 binarizes the picture of the pattern 2 taken by the camera 31 and stores it in the internal picture memory 302. The resulting picture 40 is shown in FIG. 3a in which pattern image 2' is detected as black areas and the remainder is detected as a white area. Then, when the shutter of the opening 35 is closed and the shutter of the opening 34 is opened, only the visible light incident from above through the opening 34 is directed into the detection head 25 and a picture of the leads 3 is taken as a silhouette by the camera 31. The recognition device 30 binarizes the picture of the leads 3 taken by the camera 31 and stores it in the internal pictures memory 303. The resulting picture 41 is shown in FIG. 3b in which the portions containing lead image 3' and the component 4 are shown as black areas and the remainder is shown as a white area. The recognition device 30 derives the X and Y coordinates of each pad of the pattern 2 and each lead of the leads 3 from the pictures stored in the picture memories and send these information to the controller 26. The controller 26 computes positional deviation values $\Delta X$, $\Delta Y$ and $\Delta \theta$ of the component 4 with respect to the pattern 2 and send them as correction values to the NC driver 29. Then, the NC driver 29 moves the XY-table 20 and the chuck 9 thereby completing the positioning of the component 4. After the alignment has been completed, the shutters of the openings 34 and 35 are each returned to the initial position and the whole detection head 25 is moved back to the initial position through the NC driver 29. Then, the component 4 held by the chuck 9 is lowered and mounted on the printed board 1.

Figure 5:
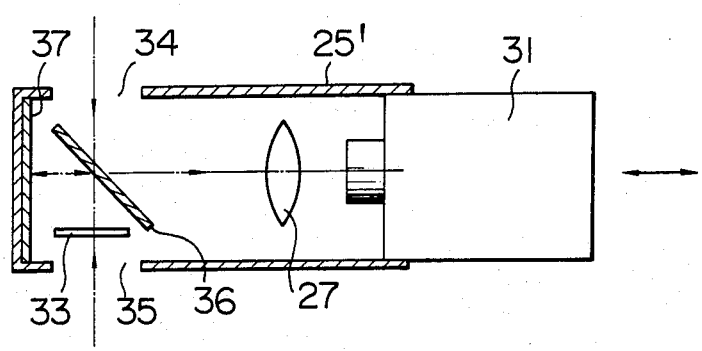
FIG. 5 is a longitudinal sectional view showing another embodiment of the detection head.

The present invention is not limited to the means of this embodiment and they may be replaced with other means. For example, the detection head 25 may be replaced with a detection head 25' shown in FIG. 5. The other mechanisms are the same as shown in FIG. 1. In the detection head 25', a filter 33 is of the same type as the filter 33 of FIG. 1 but positioned near an opening 35 inside the detection head 25' and a half mirror 36 is such that the fluorescent light incident from below is reflected to the left in the Figure, the fluorescent light incident from the left is transmitted and the visible light incident from above is reflected to the right in the Figure. A mirror 37 is a reflecting mirror such that the fluorescent light incident horizontally from the right is reflected to the right. The entire detection head 25' is movable horizontally in the same manner as the detection head 25. In the Figure, the light beams incident from below through the opening 35 are filtered by the filter 33 so that only the fluorescent light is passed, reflected by the half mirror 36, reflected by the mirror 37, passed through the half mirror 36 and projected to the camera 31 through a lens 27. On the other hand, the visible light incident from above through the opening 34 is reflected by the half mirror 36, passed horizontally straight forward and projected to the camera 31. By using this detection head 25', it is possible to detect the images of the pattern 2 and the leads 3 by a single-axis optical system. In the case of the detection head 25', however, the half mirror 36 is different from the mirror 24, that is, it is the ordinary half mirror which reflects and passes the fluorescent light and therefore the amount of the fluorescent light passed through the half mirror 36 is decreased. Thus, the quantity of the fluorescent light incident through the opening 35 must be large enough.

Also, with each of the detection heads 25 and 25', the lamps 21 and 28 may be flashed on and off instead of opening and closing the shutters of the openings 34 and 35. Also, in the case of the detection head 25, an optical fiber or the like may be used in place of the mirror 23 for changing the direction of travel of the fluorescent light passed through the filter 33.

Figure 6:
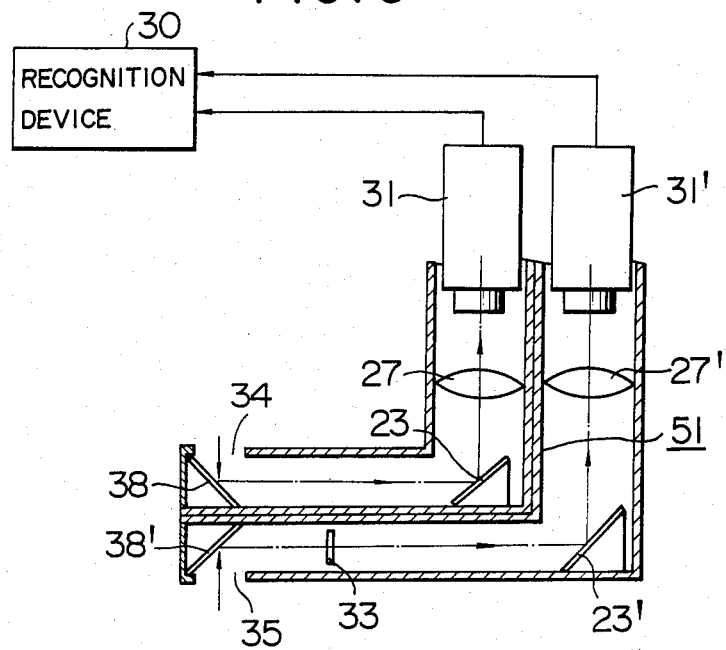
FIG. 6 is a longitudinal sectional view showing still another embodiment of the detection head.

Further, instead of projecting the fluorescent light incident through the opening 35 and the visible light incident through the opening 34 to the same camera 31 along the same optical axis as in the case of the detection head 25 or 25', it is possible to use a detection head 51 shown in FIG. 6 in which the fluorescent light and the visible light are respectively projected to separate cameras. In FIG. 6, a mirror 38 is provided to horizontally deflect the direction of travel of the visible light incident through an opening 34 and a mirror 38' deflects the fluorescent light and the reflected light from the surface of the printed board 1 incident through an opening 35. Mirrors 23 and 23' are provided to respectively deflect the visible light and the fluorescent light upward. Lenses 27 and 27' are those provided to respectively converge the visible light and the fluorescent light, and cameras 31 and 31' are provided to respectively take pictures of the leads 3 and the pattern 2. The resulting video signals from the cameras 31 and 31' are selected under the control of the control module 304 and are successively digitized by the A-D converter 301. The resulting picture data are stored in the picture memories 303 and 302, respectively. Where the detection head 51 shown in FIG. 6 is used, the different cameras are used to take pictures of the leads and the pattern and thus there is the possibility of causing a positional deviation between the two picture data themselves. While this makes it necessary to effect the proper position correction, such position correction is possible by the known techniques and no further description will be made.

Figure 7:
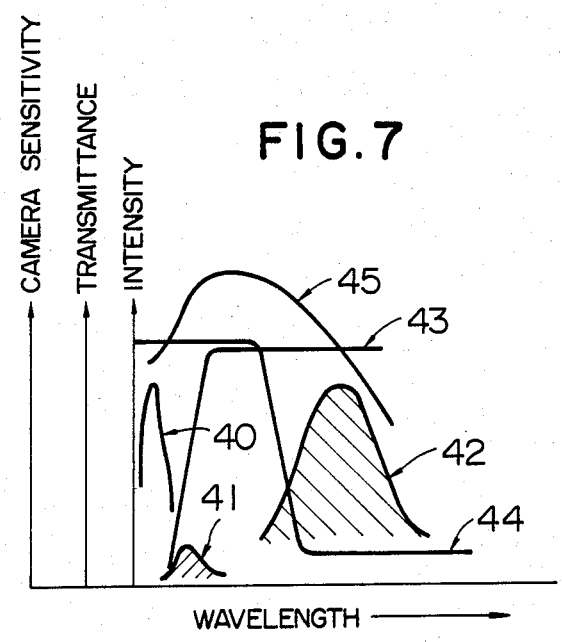
FIG. 7 is a diagram showing the relation between the wavelength and either of the light intensity, filter transmittance, mirror transmittance and camera sensitivity.

FIG. 7 is a graph showing the relation between the intensity and wavelength of various lights, the relation between the transmittance of the filter 33 and the mirror 24 and the wavelength and the relation between the sensitivity of the camera 31 and the wavelength. The abscissa represents the wavelength and the ordinates respectively represent the light intensity, transmittance and camera sensitivity. Indicated at 40 is the intensity of the reflected light from the printed board 1 illuminated by the lamps 21, 41 the intensity of the fluorescent light emitted from the printed board 1, and 42 the intensity of the visible light projected by the lamp 28 and transmitted through the leads 3. Indicated at 43 is the relation between the transmittance of the filter 33 and the wavelength. Also indicated at 44 is the relation between the transmittance of the mirror 24 and the wavelength. The Figure shows that the reflectance is high in the wavelength range where the transmittance is low. Also indicated at 45 is the camera sensitivity. It will be seen from the Figure that the reflected light 40 is cut off by the filter 33 and only the florescent light is directed to the camera. It will also be seen that the florescent light indicated at 41 is directed to the camera and the visible light is mainly reflected by the mirror 24. Also, as shown at 45, the sensitivity of the camera 31 is high to the lowintensity fluorescent light 41 and the camera 31 also has some degree of sensitivity to the visible light.

Then, the automatic alignment apparatus described in the "BACKGROUND OF THE INVENTION" employs the method of photographing first pattern with a component removed from above the pattern and then mechanically moving the component over the pattern and photographing its leads and thus there is the disadvantage of additionally causing a positional error between the two pictures during the preliminary alignment. In addition, the apparatus is of the two-camera type so that the cameras themselves are caused to malfunction due to a temperature drift or the like and the two pictures taken are not ones photographed under the same conditions thus causing a positional error between the two pictures. In accordance with the embodiments of the invention, the pattern image of pattern 2 and the lead image of leads 3 are detected simultaneously by the detection head 25 or 25' and therefore there is no danger of causing any positional error between the two images during the preliminary alignment. Also, due to the arrangement that aligns the central axes of the two images with the same optical axis, the two images are photographed by the single camera and this prevents any error due to the variations in characteristic between the different cameras caused by a temperature drift or the like.

From the foregoing description it will be seen that in accordance with the embodiments of the invention the accuracy of detection is increased by about ten times than previously by virtue of the use of a detection method utilizing a fluorescent light and a detection head constructed to align the central axes of two images with the same axis. This makes it possible to apply the apparatus of the invention to the detection of such high-precision solder pattern which has heretofore been impossible. Also, the size of the optical system including the camera is reduced to one half of the conventional automatic alignment apparatus of the type described previously and the cost of the apparatus is reduced.

Lastly, in accordance with this invention, due to the use of a detection method employing a fluorescent light for detecting the pattern on a printed board, there is the effect of detecting and correcting any positional deviation of an electronic component from a high-density pattern with a high degree of accuracy.

We claim:

1. An apparatus for aligning an electronic component with a conductor pattern on a printed board adapted for mounting the electronic component thereon, said apparatus comprising:

first illuminating means for illuminating said printed board to excite a substrate thereof to emit a fluorescent light;

second illuminating means for projecting an illuminating light to leads of said electronic component positioned above said pattern;

a detection head for admitting an image of said board pattern formed by said fluorescent light and an image of said leads formed by said lead illuminating light, said detection head including a first and second opening arranged to respectively detect said board pattern image and said lead image, mirror means arranged to transmit said fluorescent light and reflect said lead illuminating light and thereby align optical axes of said board pattern image and said lead image with the same axis, relecting mirror means arranged to respectively lead said fluorescent light and said lead illuminating light from said first and second openings into said mirror means, said reflecting mirror means having a good reflectance characteristic with respect to its associated light, and filter means inserted in an optical path of said fluorescent light for mainly transmitting said fluorescent light;

means for photographing said board pattern image and said lead image detected by said detection head;

means for recognizing said photographed board pattern image and lead image and computing the amounts of deviation in position therebetween; and means for correcting the position of said leads relative to said board pattern in accordance with said amounts of deviation.

2. An apparatus according to claim 1, wherein said first opening and said second opening of said detection head are arranged vertically, said first opening admitting said board pattern image from below, and said second opening admitting said lead image from above.

3. An apparatus according to claim 2, wherein said reflecting mirror means include first, second and third reflecting mirrors, said first reflecting mirror being arranged between said second opening and said mirror means so that the lead image admitted into said detection head is led in a horizontal direction prior to reaching said mirror means, and said second and third reflecting mirrors being arranged between said first opening and said mirror means so that said board pattern image admitted into said detection head is led in a horizontal direction by said second reflecting mirror and then led upward by said third reflecting mirror prior to reaching said mirror means.

4. An apparatus according to claim 1, wherein said reflecting mirror means include first, second and third reflecting mirrors, said first reflecting mirror being arranged between said second opening and said mirror means so that the lead image admitted into said detection head is led in a horizontal direction prior to reaching said mirror means, and said second and third reflecting mirrors being arranged between said first opening and said mirror means so that said board pattern image admitted into said detection head is led in a horizontal direction by said second reflecting mirror and then led upward by said third reflecting mirror prior to reaching said mirror means.

5. An apparatus according to claim 1, wherein said filter means is provided between said first opening and said mirror means along said optical path.

* * * * *